(12) United States Patent
Kwak et al.

(10) Patent No.: US 8,174,183 B2
(45) Date of Patent: May 8, 2012

(54) ORGANIC LIGHT EMITTING DISPLAY AND MOTHER SUBSTRATE OF THE SAME

(75) Inventors: Won-kyu Kwak, Suwon (KR); Hae-jin Chun, Suwon (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 927 days.

(21) Appl. No.: 12/122,759

(22) Filed: May 19, 2008

(65) Prior Publication Data

US 2009/0045727 A1 Feb. 19, 2009

(30) Foreign Application Priority Data

Aug. 17, 2007 (KR) .................. 10-2007-0082748

(51) Int. Cl.
H05B 33/02 (2006.01)
(52) U.S. Cl. .......................... 313/504; 445/24
(58) Field of Classification Search .............. 445/24; 324/770; 345/76
See application file for complete search history.

(56) References Cited

U.S. PATENT DOCUMENTS

2004/0256620 A1* 12/2004 Yamazaki et al. ............. 257/66
2007/0132376 A1* 6/2007 Heo ............................... 313/505
2008/0170013 A1* 7/2008 Jeong et al. .................... 345/82

FOREIGN PATENT DOCUMENTS

| JP | 2004-341216 | 12/2004 |
| KR | 2002-0041212 A | 6/2002 |
| KR | 10-2006-0036623 | 5/2006 |
| KR | 10-2006-0094324 A | 8/2006 |
| KR | 10-2006-0110343 | 10/2006 |
| KR | 10-2007-0001583 A | 1/2007 |
| KR | 10-2007-0032485 A | 3/2007 |

OTHER PUBLICATIONS

Korean Patent Abstracts for Publication No. 1020020041212 A, published on Jun. 1, 2002 in the name of Cho, Gyu Su et al.
Korean Patent Abstracts for Publication No. 1020060094324 A, published on Aug. 29, 2006 in the name of Park, Ki Ryun.
Korean Patent Abstracts for Publication No. 1020070001583 A, published on Jan. 4, 2007 in the name of Kwak, Won Kyu.
Korean Patent Abstracts for Publication No. 1020070032485 A, published on Mar. 22, 2007 in the name of Kwak, Won Kyu et al.
Patent Abstracts of Japan, Publication No. 2004-341216; Date of Publication: Dec. 2, 2004; in the name of Sakahito Yoshii.

(Continued)

*Primary Examiner* — Toan Ton
*Assistant Examiner* — Andrew Coughlin
(74) *Attorney, Agent, or Firm* — Christie, Parker & Hale, LLP

(57) ABSTRACT

A mother substrate is provided including organic light emitting displays. The organic light emitting displays have a pad unit formed at one side. First and second wiring line groups extend in first and second directions, respectively, on the organic light emitting displays. The first and second wiring line groups are coupled to each pad unit. Intersection parts between the first and second wiring line groups are within scribing lines of each of the organic light emitting displays in which the first and second wiring line groups intersect. Partial regions of the second wiring line group excluding the intersection parts are within scribing lines of an adjacent one of each of the organic light emitting displays. Via holes are located through a protecting layer to expose the first and second wiring line groups where the first and second wiring line groups couple to the pad unit.

8 Claims, 6 Drawing Sheets

OTHER PUBLICATIONS

Korean Patent Abstracts, Publication No. 1020060036623 A; Date of Publication: May 2, 2006; in the name of Kyoung Soo Lee, et al.

Korean Patent Abstracts, Publication No. 1020060110343 A; Date of Publication: Oct. 24, 2006; in the name of Noriyoshi Matsuura.

\* cited by examiner

ORGANIC LIGHT EMITTING DISPLAY AND MOTHER SUBSTRATE OF THE SAME

CROSS-REFERENCE TO RELATED APPLICATION

This application claims priority to and the benefit of Korean Patent Application No. 10-2007-0082748, filed on Aug. 17, 2007, in the Korean Intellectual Property Office, the entire content of which is incorporated herein by reference.

BACKGROUND

1. Field of the Invention

The present invention relates to an organic light emitting display and a mother substrate having a plurality of organic light emitting displays that can be inspected and to preventing the induction of electrostatic discharge (ESD) after scribing.

2. Discussion of Related Art

In fabrication of organic light emitting displays, the organic light emitting displays are formed on a mother substrate and then they are scribed and divided into individual organic light emitting displays. Subsequently, the individual organic light emitting displays are separately inspected by an apparatus.

When circuit wiring lines that constitute the organic light emitting display are changed or the size of the organic light emitting display is changed, an inspection apparatus or a jig required for inspection must be changed. In addition, because the organic light emitting displays are separately inspected, the time to inspect the organic light emitting displays is long and the cost is high such that the effectiveness of the inspection deteriorates.

Therefore, a need exists for the plurality organic light emitting displays to be inspected on the mother substrate in a unit sheet before scribing. In addition, a need exists to ensure the stability of wiring lines run on the mother substrate requisite for the inspection. Furthermore, after the organic light emitting displays are separated from the mother substrate by the scribing process, ESD can be induced from the outside through the wiring lines utilized for the inspection on the mother substrate. Therefore, a need exists to prevent the induction of ESD in the scribed organic light emitting displays in order to secure the stability of the operation of the organic light emitting display.

SUMMARY OF THE INVENTION

In an exemplary embodiment of the present invention, a mother substrate of organic light emitting displays is provided having a plurality of organic light emitting displays on the mother substrate. The plurality of organic light emitting displays are separable at scribing lines between each of the organic light emitting displays. Each of the organic light emitting displays has a pad unit formed at one side of the organic light emitting display. A first wiring line group extends in a first direction on the organic light emitting displays in a same column. The first wiring line group is coupled to each pad unit of the organic light emitting displays in the same column. A second wiring line group extends in a second direction on the organic light emitting displays in a same row. The second wiring line group is coupled to each pad unit of the organic light emitting displays in the same row. Intersection parts between the first wiring line group and the second wiring line group are within the scribing lines of each of the organic light emitting displays in which the first wiring line group and the second wiring line group intersect. Partial regions of the second wiring line group excluding the intersection parts are within the scribing lines of an adjacent one of each of the organic light emitting displays. Via holes are located through a protecting layer to expose the first wiring line group where the first wiring line group couples to the pad unit and to expose the second wiring line group where the second wiring line group couples to the pad unit.

In one embodiment, a last pad at one edge of each pad unit is a bias pad, and aligning marks extend in a second direction on the bias pad and are exposed through the via holes where the second wiring line group couples to the pad unit.

In one embodiment, a coupling wiring line for electrically coupling the first wiring line group and an organic light emitting display of an $i^{th}$ row is electrically coupled to the organic light emitting display of the $i^{th}$ row from one region of the first wiring line group on the organic light emitting display of the $i^{th}$ row via the aligning marks, to a dummy region on an organic light emitting display in the $(i+1)^{th}$ row, and to the pad unit.

In one embodiment, additional via holes are located through a protecting layer to expose one region of the coupling wiring line where the coupling wiring line couples to the pad unit.

In one embodiment, the intersection parts between the first wiring line group and the second wiring line group are positioned at a first edge of each of the organic light emitting displays, the first edge of an organic light emitting display in an $i^{th}$ row being adjacent to an organic light emitting display in an $(i+1)^{th}$ row.

In one embodiment, when the intersecting regions are in an $i^{th}$ row, the partial regions are in a region of an $(i+1)^{th}$ row adjacent the $i^{th}$ row.

In one embodiment, each of the organic light emitting displays includes a first substrate including a pixel unit and a non-pixel unit around the pixel unit; a second substrate facing the first substrate to overlap one region of the first substrate including the pixel unit; and a seal for attaching the second substrate to the first substrate, the seal being at an edge of the second substrate. The seal does not overlap the intersection parts between the first wiring line group and the second wiring line group.

In one embodiment, the first wiring line group and the second wiring line group comprise a plurality of wiring lines for supplying power sources or signals to the organic light emitting displays.

In one embodiment, each of the organic light emitting displays includes a pixel unit having a plurality of pixels coupled to scan lines and to data lines; a scan driver for supplying scan signals to the scan lines; an inspector circuit coupled to one end of each of the data lines; and a data distributor coupled to the other ends of the data lines.

In one embodiment, the inspector circuit includes a plurality of transistors coupled between wiring lines of the first wiring line group and the data lines or between the second wiring line group and the data lines, and gate electrodes of the transistors are commonly coupled to one wiring line of the first wiring line group or the second wiring line group such that the transistors can be simultaneously turned on.

In one embodiment, the data distributor is turned off by a bias signal supplied from another wiring line of the first wiring line group or the second wiring line group while inspection signals are supplied from partial wiring lines of the first wiring line group or the second wiring line group to the inspector circuit.

In another exemplary embodiment of the present invention, an organic light emitting display is provided having a pixel unit having a plurality of pixels positioned in intersection parts between scan lines and data lines; a scan driver for supplying scan signals to the scan lines; a data driver for supplying data signals to the data lines; a pad unit having a plurality of pads for supplying driving power sources or signals to at least one of the pixel unit, the scan driver, and the data driver; a first wiring line group extending in a first direction at an edge of the pixel unit; and first bending wiring lines bent at one or more edges of the pad unit to intersect the first wiring line group. The pad unit includes at least one bias pad extended in a direction of the first bending wiring lines and is electrically coupled to the first bending wiring lines.

In one embodiment, the first bending wiring lines are at both edges of the pad unit, and a last pad on each side of the pad unit is a bias pad and is coupled to adjacent first bending wiring lines.

In one embodiment, the bias pad is electrically coupled to the first wiring line group, and the first wiring line group and the first bending wiring lines receive a bias signal from the bias pad.

In one embodiment, second bending wiring lines are extending in a second direction at an upper edge of the pixel unit, both ends of the second bending wiring line being bent to not intersect the first wiring line group.

In one embodiment, a first substrate on which the pixel unit, the scan driver, the data driver, the pad unit, the first wiring line group, the first bending wiring lines, and the second bending wiring lines in a non-pixel region around the pixel unit, are formed; a second substrate facing the first substrate to overlap one region of the first substrate including the pixel unit; and a seal for attaching the second substrate to the first substrate at an edge of the second substrate. The seal does not overlap the intersection parts between the first wiring line group and the first bending wiring lines.

In one embodiment, a transistor group is coupled to one end of each of the data lines; and a data distributor coupled between the other ends of the data lines and the data driver.

In one embodiment, the transistor group is turned off by signals supplied from the pad unit.

In one embodiment, the first wiring line group and the first bending wiring lines are electrically insulated from the pixel unit, the scan driver, and the data driver.

DETAILED DESCRIPTION OF EXEMPLARY EMBODIMENTS

Figure 1:
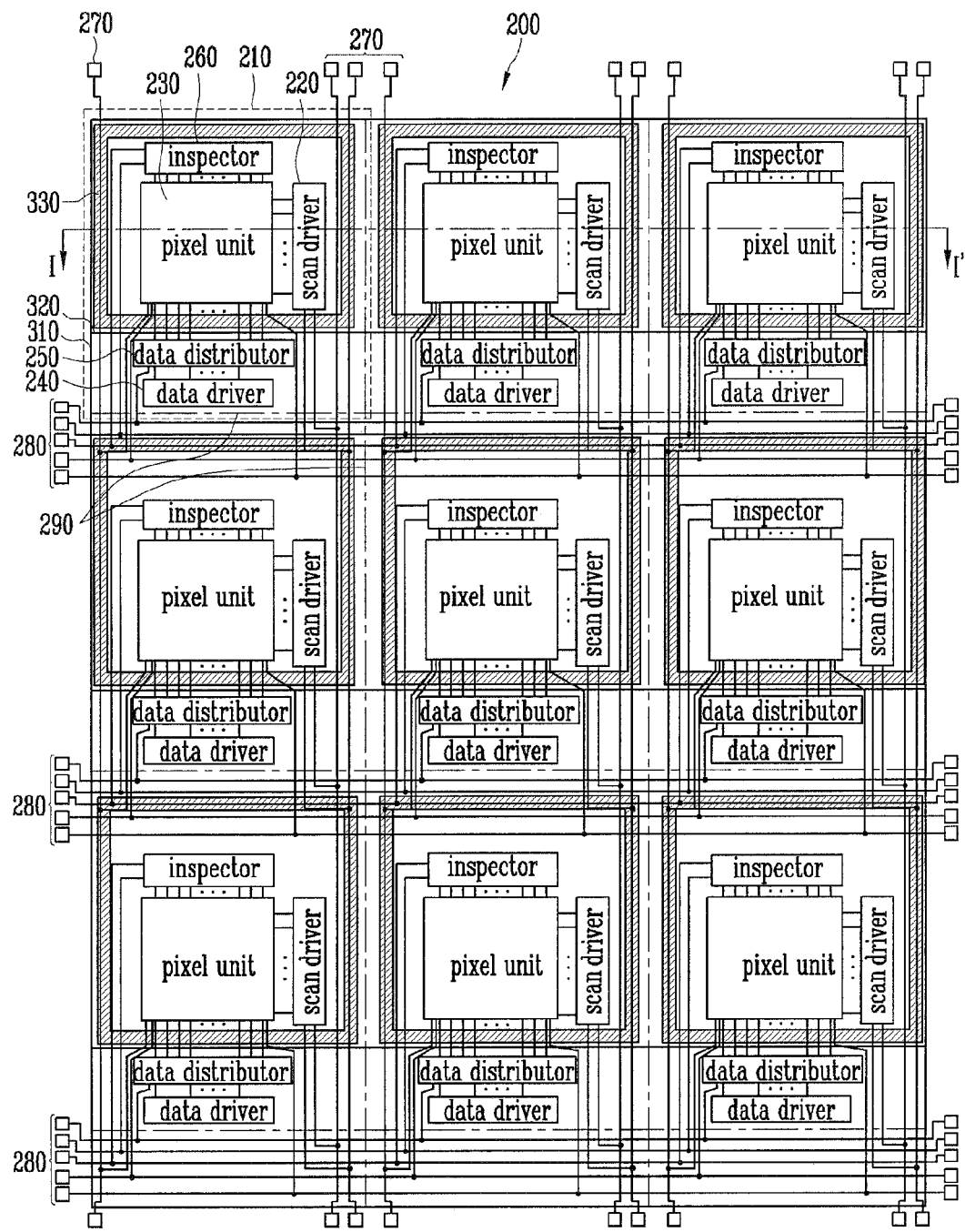
FIG. 1 is a block diagram illustrating a mother substrate of an organic light emitting display according to an exemplary embodiment of the present invention.
Figure 2:
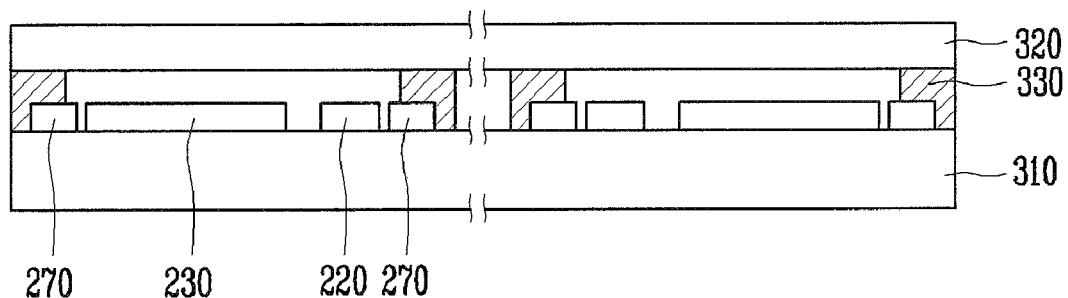
FIG. 2 is a sectional view taken along the line I-I' of FIG. 1.
Figure 3:
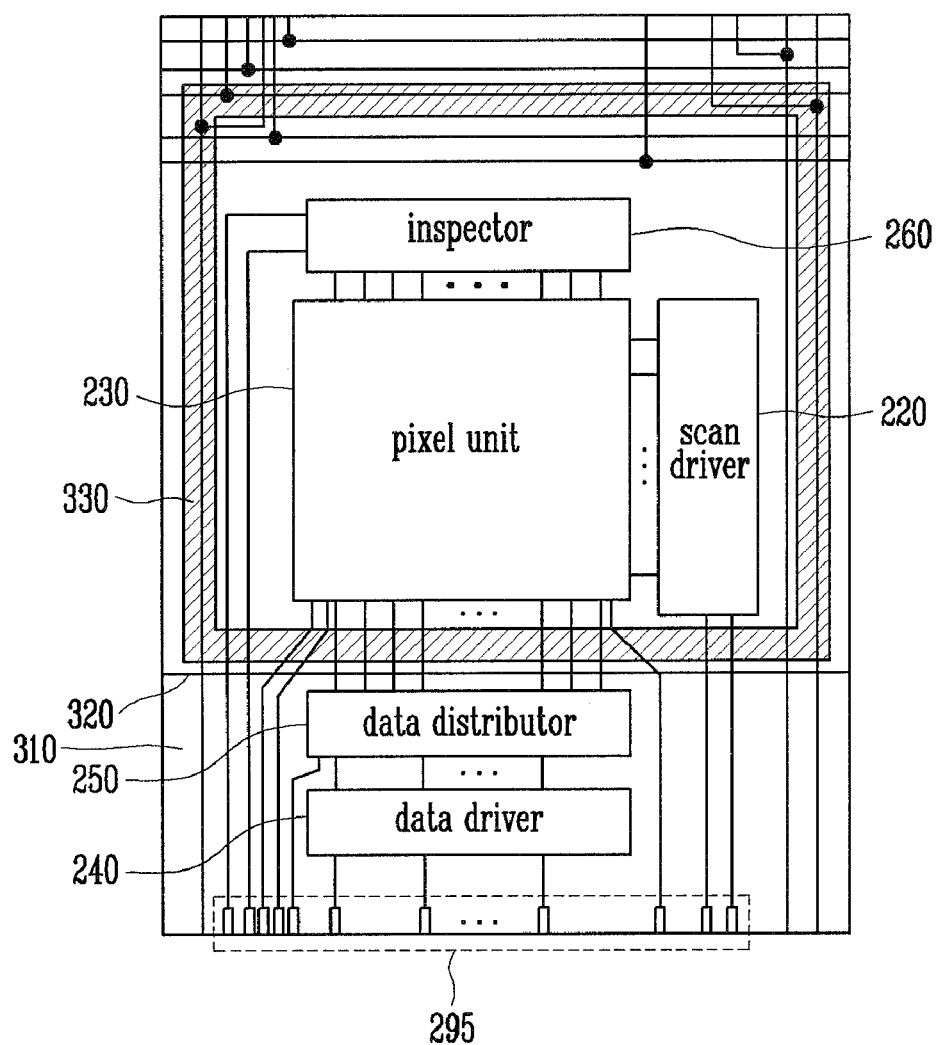
FIG. 3 is a block diagram illustrating the scribed organic light emitting display in FIG. 1.

Referring to FIG. 1, FIG. 2, and FIG. 3, a mother substrate 200 of an organic light emitting display according to an exemplary embodiment of the present invention includes a plurality of organic light emitting displays 210 arranged in a matrix in a region defined by scribing lines 290, a first wiring ling group 270 arranged in a first direction at the edges between the organic light emitting displays 210, and a second wiring line group 280 arranged in a second direction at the edges between the organic light emitting displays 210.

Each of the organic light emitting displays 210 includes a scan driver 220, a pixel unit 230, a data driver 240, a data distributor 250, and an inspector 260.

The scan driver 220 is driven by the power sources and scan control signals supplied from the first wiring line group 270 during the inspection in a unit sheet that is performed on the mother substrate 200 to supply a scan signal to the pixel unit 230. The pixel unit 230 includes a plurality of pixels including organic light emitting diodes (OLEDs). The pixel unit 230 receives power sources (e.g., predetermined power sources) from the first and second wiring line groups 270, 280 during the inspection in a unit sheet and receives the scan signal from the scan driver 220 and an inspection signal from the inspector 260. The pixel unit 230, upon receiving the power sources, the scan signal, and the inspection signal, displays an image corresponding to the power sources, the scan signal, and the inspection signal.

On the other hand, after the inspection in a unit sheet is completed and the organic light emitting displays 210 are scribed from the mother substrate 200, the pixel unit 230 displays an image to correspond to the power sources supplied from a pad, the scan signal supplied from the scan driver 220, and the data signal supplied from the data distributor 250.

The data driver 240 generates a data signal to correspond to data supplied from the outside after the organic light emitting displays 210 are scribed from the mother substrate 200. The data drivers 240 can be formed on the mother substrate 200 or can be mounted on the organic light emitting displays 210 in the form of chips after scribing.

The data distributor 250 supplies the data signals supplied to the output lines of the data drivers 240 to the three data lines of red, green, and blue subpixels. The data distributor 250 reduces the number of channels of the data driver 240 to be useful for a high resolution display. For convenience, one pixel included in the pixel unit 230 is described as consisting of three subpixels, i.e., a red, a green, and a blue subpixel. However, the present invention is not thus limited.

The data distributor 250 is set to be turned off when at least one organic light emitting displays 210 are inspected on the mother substrate 200. Therefore, the data distributor 250 receives a bias signal from the second wiring line group 280 during the inspection in a unit sheet. In an exemplary embodiment, the data driver 240 and the data distributor 250 are formed below the pixel unit 230 to be coupled to one end of the data lines.

The inspector 260 supplies red, green, and blue inspection signals to the red, green, and blue subpixels of the pixel unit 230 in response to the inspection control signals supplied during the inspection in a unit sheet. The inspection signals can be variously set as signals for inspecting picture quality or signals for forward/reverse aging. In an exemplary embodiment, the inspector 260 is formed above the pixel unit 230 to face the data driver 240 and the data distributor 250 to be coupled to the other ends of the data lines.

The first wiring line group 270 is formed in a vertical direction (a first direction) to be commonly coupled to the organic light emitting displays 210 positioned in the same column on the mother substrate 200.

The second wiring line group 280 is formed in a horizontal direction (a second direction) to be commonly coupled to the organic light emitting displays 210 positioned in the same row on the mother substrate 200.

The first and second wiring line groups 270, 280 supply power sources and signals to at least one of the scan driver 220, the pixel unit 230, the data distributor 250, and the inspector 260 formed in the organic light emitting displays 210 on which inspection is performed while at least one of the organic light emitting displays 210 are inspected on the mother substrate 200.

Electrical coupling points between the first and second wiring line groups 270, 280 and the organic light emitting displays 210 are positioned at the edges of the scribing lines 290 such that the first and second wiring line groups 270, 280 and the organic light emitting displays 210 are electrically insulated after scribing.

According to an exemplary embodiment of the present invention, the plurality of organic light emitting displays 210 are inspected and the power sources and signals required for inspection are supplied to the organic light emitting displays 210 through the first and second wiring line groups 270, 280 before the organic light emitting displays 210 are scribed.

To be specific, the power sources and signals for inspection are supplied to the first and second wiring line groups 270, 280 coupled to the plurality of organic light emitting displays 210 such that inspections (e.g., predetermined inspections) such as forward/reverse aging and picture quality inspection are performed on the organic light emitting displays 210 that received the power sources and signals.

Therefore, it is possible to reduce inspection time and cost such that it is possible to improve the efficiency of inspection. Furthermore, if the circuit wiring lines that constitute the organic light emitting display 210 are changed or the size of the organic light emitting display 210 is changed, inspection can be performed without changing the inspection apparatus or the jig.

In addition, all of the wiring lines that supply the power sources and the signals are arranged in two directions rather than in one direction so that specific organic light emitting displays 210 formed on the mother substrate 200 can be inspected. That is, the signals are arranged in the first and second wiring line groups 270, 280, which because the signals are formed in different directions, allows for specific organic light emitting displays 210 on the mother substrate 200 to be inspected.

For example, the wiring lines that receive a first pixel power source ELVDD are arranged in the first wiring line group 270, the wiring lines that receive a second pixel power source ELVSS are arranged in the second wiring line group 280, and the power sources and signals are supplied to the first and second wiring line groups 270, 280 coupled to the organic light emitting display 210 so that inspection can be selectively performed on at least one organic light emitting displays 210.

That is, according to the mother substrate 200 of the organic light emitting display of an exemplary embodiment of the present invention, the first and second wiring line groups 270, 280 are formed to inspect one or the plurality of organic light emitting displays 210 on the mother substrate 200.

The organic light emitting displays formed on the substrate 200 are protected by a supporting substrate (first substrate) 310, a sealing substrate (second substrate) 320 provided to overlap at least one region of the support substrate 310, and a sealing material 330 for attaching the supporting substrate 310 and the sealing substrate 320 to each other along the edge of the sealing substrate 320.

In particular, the pixel unit 230 included in each of the organic light emitting displays 210 is positioned in a sealing region between the supporting substrate 310 and the sealing substrate 320. Therefore, the OLEDs formed in the pixels that constitute the pixel unit 230 are protected against oxygen and moisture.

For convenience, the first wiring line group 270 that overlaps the sealing material 330 is illustrated in FIG. 2 as one wiring line. However, the first wiring line group 270 can include a plurality of wiring lines. In addition, the first wiring line group 270 and the sealing material 330 are depicted in FIG. 2 contacting each other. However, in an exemplary embodiment, at least one insulating layer may be further provided between the first wiring line group 270 and the sealing material 330.

In the mother substrate 200 of the organic light emitting display according to the above-described embodiment, the sealing material 330 is provided to partially overlap the intersection part between the first wiring line group 270 and the second wiring line group 280.

As described above, when the sealing material 330 is positioned in the intersection part between the first wiring line group 270 and the second wiring line group 280 and when a sealing process of attaching the supporting substrate 310 and the sealing substrate 320 to each other is performed, a short defect may be generated in partial wiring lines included in the first and second wiring line groups 270, 280.

In this case, while the inspection in a unit sheet is performed through the first and second wiring line groups 270, 280, proper power sources and/or signals are not supplied to the organic light emitting displays 210 coupled to the first and second wiring line groups 270, 280 in which a short defect is generated such that the inspection in a unit sheet cannot be effectively performed.

In addition, when the organic light emitting displays 210 are separated from the mother substrate 200 by the scribing process, as illustrated in FIG. 3, the ends of the first and second wiring line groups 270, 280 formed in each panel are floated without being connected to a pad unit 295.

The floated first and/or second wiring groups 270, 280 serve as a path through which electrostatic discharge (ESD) from the outside is transmitted to the panel so that the operation of the scribed organic light emitting display 210 is made unstable.

Therefore, according to an exemplary embodiment of the present invention, a method of preventing the generation of a short between the first and second wiring line groups 270, 280 and of preventing or minimizing the induction of the ESD to the scribed organic light emitting display 210 is provided.

Figure 4:
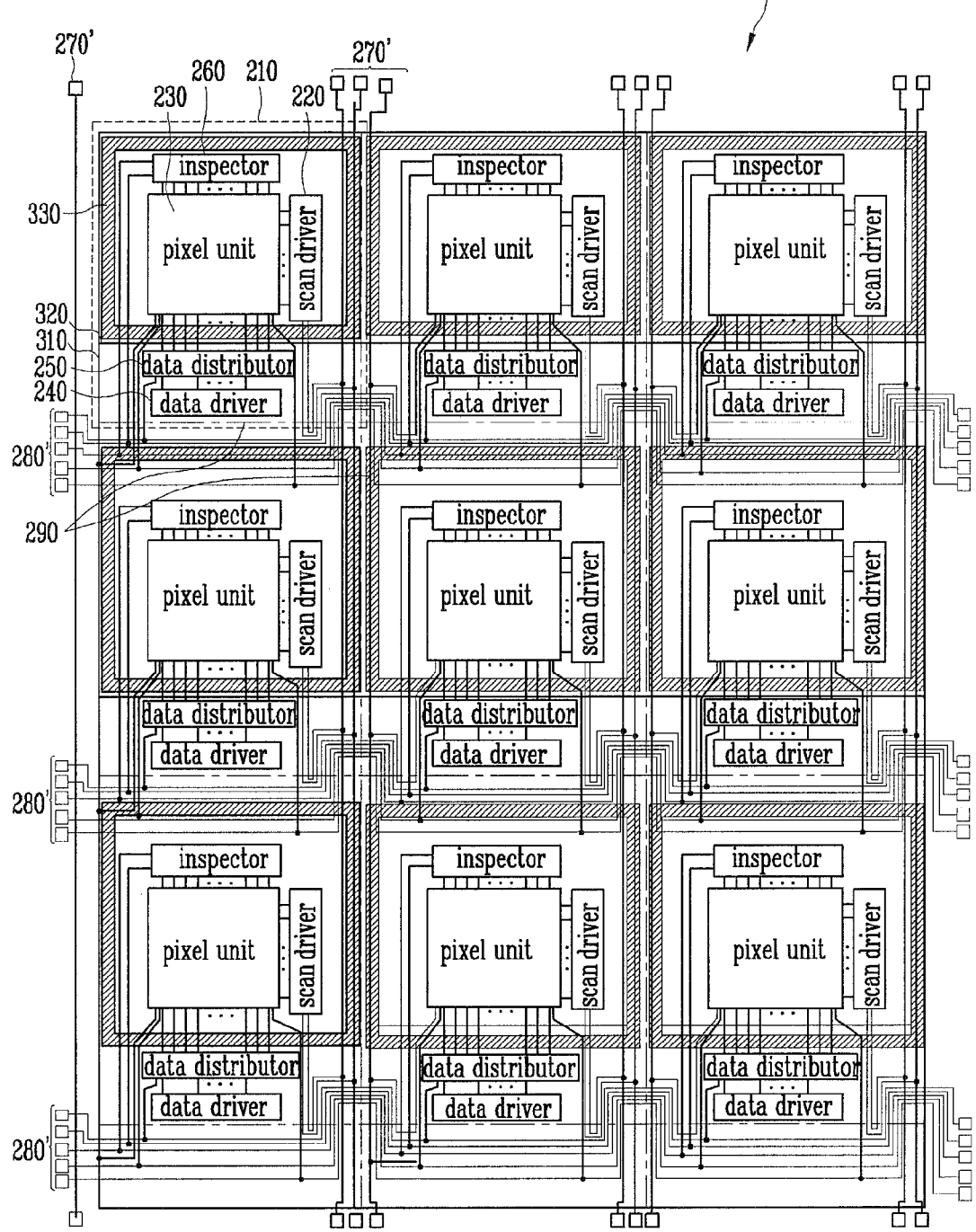
FIG. 4 is a block diagram illustrating a mother substrate of an organic light emitting display according to another exemplary embodiment of the present invention.
Figure 5:
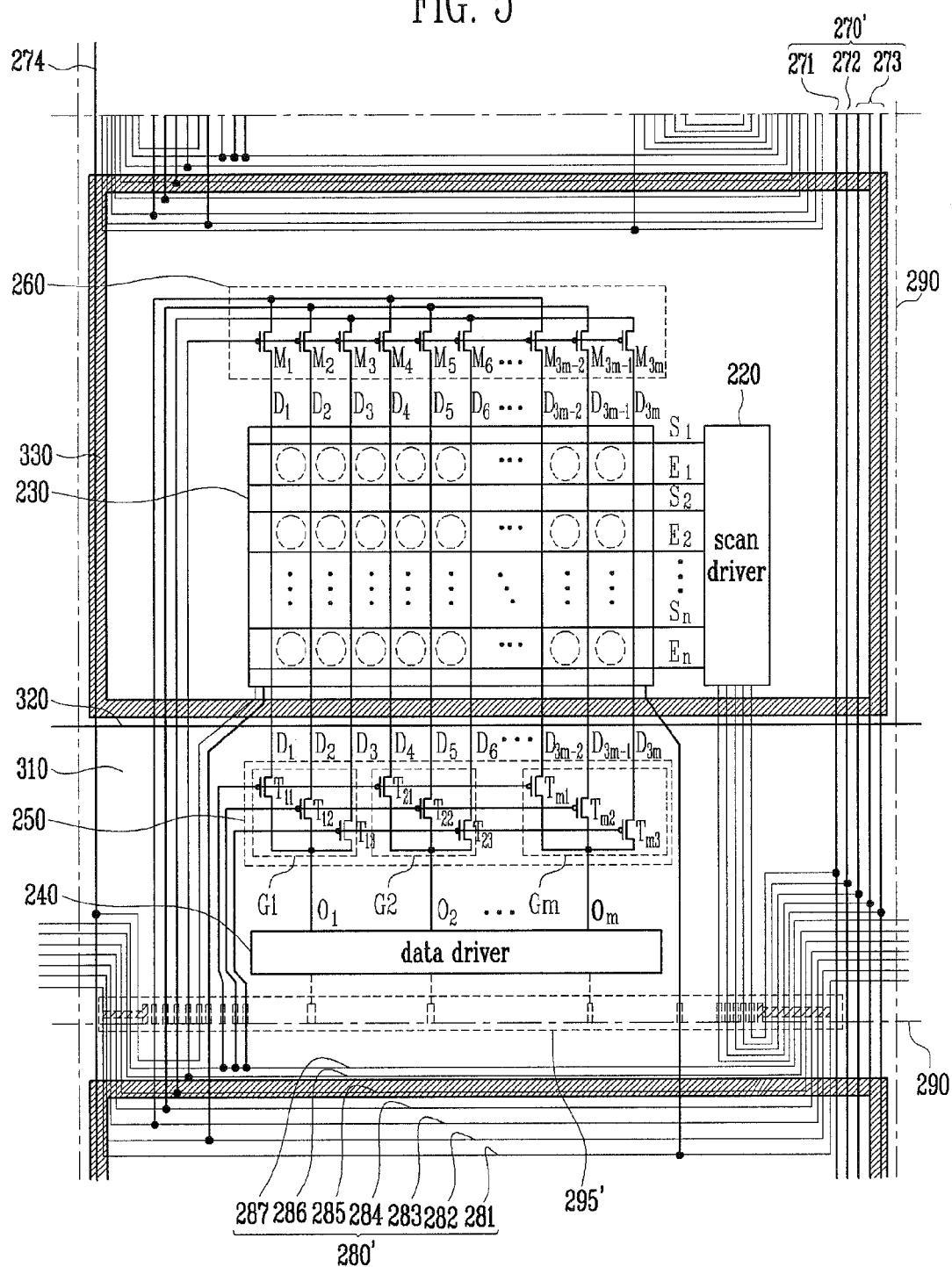
FIG. 5 is a detailed block diagram illustrating the structures of the organic light emitting display and the wiring line groups in FIG. 4.
Figure 6:
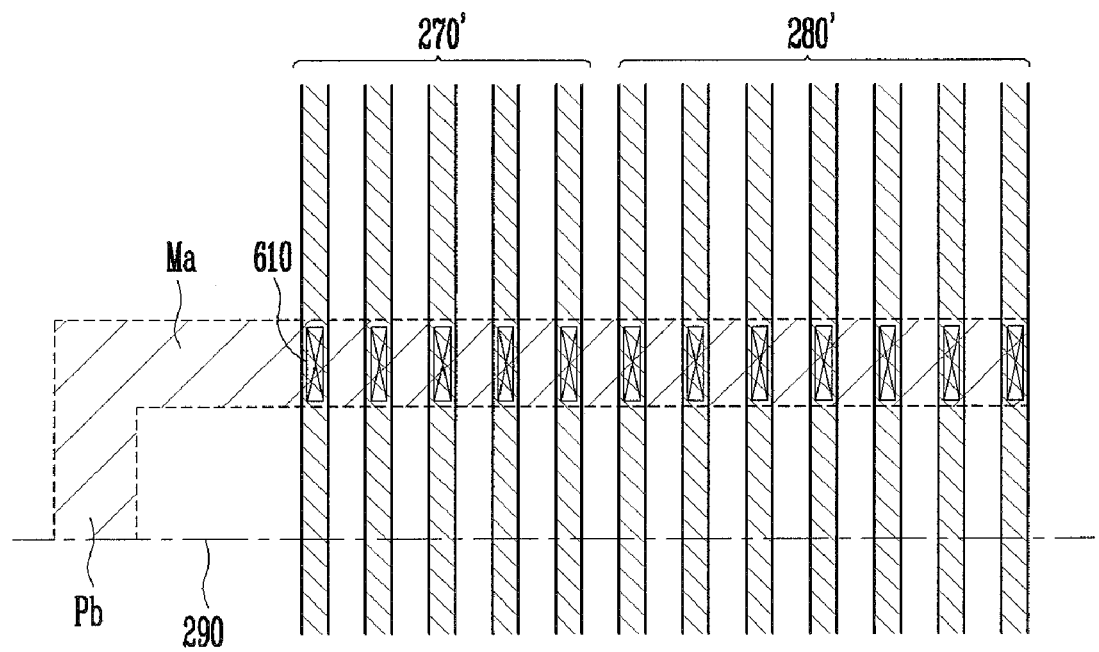
FIG. 6 is a block diagram illustrating the enlargement of the region A in FIG. 5.

FIG. 4 is a block diagram illustrating a mother substrate 200' of an organic light emitting display according to another exemplary embodiment of the present invention. FIG. 5 is a detailed block diagram illustrating the structures of the organic light emitting display and the wiring line groups in FIG. 4. FIG. 6 is a block diagram illustrating the enlargement of the region A in FIG. 5. In FIG. 4, FIG. 5, and FIG. 6, the same elements as the elements in FIG. 1, FIG. 2, and FIG. 3 are denoted by the same reference numerals and a detailed description thereof will be omitted.

Referring to FIG. 4, FIG. 5, and FIG. 6, a mother substrate 200' of an organic light emitting display according to another exemplary embodiment of the present invention includes a plurality of organic light emitting displays 210 arranged in a matrix and a first wiring group 270' arranged in a first direction and a second wiring groups 280' arranged in a second direction. Each of the organic light emitting displays 210 includes a scan driver 220, a pixel unit 230, a data driver 240, a data distributor 250, and an inspector 260.

The data distributor 250 includes a plurality of group transistors G1 to Gm coupled between data lines (D) and output lines (O) of the data driver 240 as illustrated in FIG. 4. Each of the group transistors G1 to Gm includes first transistors $T_{11}$, $T_{21}$, ... and $T_{m1}$ coupled to the data lines $D_1$, $D_4$, ..., $D_{3m-2}$ of a red subpixel, second transistors $T_{12}$, $T_{22}$, ..., and $T_{m2}$ coupled to the data lines $D_2$, $D_5$, ..., and $D_{3m-1}$ of a green subpixel, and third transistors $T_{13}$, $T_{23}$, ..., and $T_{m3}$ coupled to the data lines $D_3$, $D_6$, ..., and $D_{3m}$ of a blue subpixel. The first transistors $T_{11}$, $T_{21}$, ..., and $T_{m1}$ receive red clock signals from the outside. The second transistors $T_{12}$, $T_{22}$, ..., and $T_{m2}$ receive green clock signals. The third transistors $T_{13}$, $T_{23}$, ..., and $T_{m3}$ receive blue clock signals. Hereinafter, the first to third transistors $T_{11}$ to $T_{m3}$ included in the group transistors G1 to Gm are referred to as distribution transistors.

The distribution transistors $T_{11}$ to $T_{m3}$ supply the data signals supplied from the output lines $O_1$ to $O_m$ of the data driver 240 to the data lines $D_1$ to $D_{3m}$ in response to the red, green, and blue clock signals. The red clock signal, the green clock signal, and the blue clock signal are controlled to display a color image. For example, the red clock signal, the green clock signal, and blue clock signal are supplied at different times to display red, green, and blue images. In addition, the red clock signal, the green clock signal, and the blue clock signal are simultaneously supplied to display a white image.

The data distributor 250 is not used for the inspection in a unit sheet using the first and second wiring line groups 270', 280'. When the inspection in a unit sheet is performed using the data distributor 250, the data distributor 250 must receive the red clock signal, the green clock signal, and the blue clock signal from the first and/or second wiring line groups 270', 280'.

However, the first and second wiring line groups 270', 280' are longitudinally formed on the mother substrate 200' and a signal delay may be generated as the red clock signal, the green clock signal, and the blue clock signal pass through the first and second wiring line groups 270', 280'. As described above, when a delay is generated in the red clock signal, the green clock signal, and the blue clock signal, a time for pixel circuits to charge a data voltage is not secured such that a proper image may not be displayed. In addition, it is difficult to synchronize an inspection control signal, an inspection signal, the red clock signal, the green clock signal, and the blue clock signal with each other due to the signal delay.

Therefore, according to an exemplary embodiment of the present invention, during the inspection in a unit sheet, the data distributor 250 is set to be turned off and the inspector 260 is additionally provided so that the inspection signal is directly supplied to the pixel unit 230 through the inspector 260 without passing through the data driver 240 and the data distributor 250 during the inspection in a unit sheet.

Therefore, during the inspection in a unit sheet, the data distributor 250 receives a bias signal that turns off the distribution transistors $T_{11}$ to $T_{m3}$ included in the data distributor 250 from a $17^{th}$ wiring line 287 included in the second wiring line group 280'. That is, during the inspection in a unit sheet, the gate electrodes of the distribution transistors $T_{11}$ to $T_{m3}$ are coupled to the $17^{th}$ wiring line 287 to receive the bias signal from the $17^{th}$ wiring line 287. The distribution transistors $T_{11}$ to $T_{m3}$ that received the bias signal are maintained to be turned off. The distribution transistors $T_{11}$ and $T_{m3}$ of the data distributor 250 and the transistors $M_1$ to $M_{3m}$ included in the inspector 260 are coupled to the opposite ends of the data lines (D). For example, when the distribution transistors $T_{11}$ to $T_{m3}$ of the data distributor 250 are connected to one end of each of the data lines D, the transistors $M_1$ to $M_{3m}$ included in the inspector 260 are coupled to the other ends of the data lines (D). The inspector 260 includes the plurality of transistors $M_1$ to $M_{3m}$ whose gate electrodes are commonly coupled to the $16^{th}$ wiring line 286 included in the second wiring line group 280' for the inspection in a unit sheet as illustrated in FIG. 5.

The source electrodes of the transistors $M_1$ to $M_{3m}$ are coupled to $13^{th}$, $14^{th}$, and $15^{th}$ wiring lines 283, 284, 285 and the drain electrodes of the transistors $M_1$ to $M_{3m}$ are coupled to one of the data lines $D_1$ to $D_{3m}$. The transistors $M_1$, $M_4$, ..., and $M_{3m-2}$ coupled to the $13^{th}$ wiring line 283 are coupled to the data lines $D_1$, $D_4$, ..., and $D_{3m-2}$ of the red subpixel, the transistors $M_2$, $M_5$, ..., and $M_{3m-1}$ coupled to the $14^{th}$ wiring line 284 are coupled to the data lines $D_2$, $D_5$, ..., and $D_{3m-1}$ of the green subpixel, and the transistors $M_3$, $M_6$, ..., and $M_{3m}$ coupled to the $15^{th}$ wiring line 285 are coupled to the data lines $D_3$, $D_6$, ..., and $D_{3m}$ of the blue subpixel.

The transistors $M_1$ to $M_{3m}$ included in the inspector 260 are simultaneously turned on in response to the inspection control signal supplied from the $16^{th}$ wiring line 286 during the inspection in a unit sheet to supply the inspection signals supplied from the $13^{th}$, $14^{th}$, and $15^{th}$ wiring lines 283, 284, 285 to the data lines $D_1$ to $D_{3m}$.

The inspection signals, that is, the red, green, and blue inspection signals, supplied from the $13^{th}$, $14^{th}$, and $15^{th}$ wiring lines 283, 284, 285 to the data lines $D_1$ to $D_{3m}$ via the inspector 260 can be supplied at different times in order to display a predetermined color image and can be simultaneously supplied. That is, according to an exemplary embodiment, in a state where the inspection control signal is supplied to the inspector 260 through the $16^{th}$ wiring line 286, the color image is displayed in response to the supply times of the red, green, and blue inspection signals supplied to the $13^{th}$, $14^{th}$, and $15^{th}$ wiring lines 283, 284, 285 such that the inspection is performed.

The inspector 260 is provided above the pixel 230 to face the data driver 240 and the data distributor 250 and to be coupled to the other ends of the data lines (D).

On the other hand, the above-described inspector 260 is set to be maintained to be turned off in response to the control signal supplied from the outside when the inspection is completed. That is, the inspector 260 is maintained to be turned off when the organic light emitting displays 210 are normally operated after being scribed from the mother substrate 200'.

The first wiring line group 270' is formed in the region between the organic light emitting displays 210 in the first direction to be commonly coupled to the organic light emitting displays 210 positioned in the same column of the mother substrate 200'.

The first wiring group 270' includes a first wiring line 271 that receives a first scan driving power source VDD, a second wiring line 272 that receives a second scan driving power source VSS, third wiring lines 273 that receive scan control signals, and a fourth wiring line 274 that receives a first pixel power source ELVDD.

The first wiring line 271 supplies the first scan driving power source supplied during the inspection in a unit sheet to the scan driver 220 formed in each of the organic light emitting displays 210.

The second wiring line 272 supplies the second scan driving power source VSS supplied during the inspection in a unit sheet to the scan driver formed in each of the organic light emitting displays 210.

The third wiring lines 273 supplies the scan control signals supplied during the inspection in a unit sheet to the scan driver 220 formed in each of the organic light emitting displays 210. The scan control signals include the clock signal, the output enable signal, and the start pulse of the scan driver 220. The number of scan control signals supplied to the scan driver 220 varies with the circuit structure of the scan driver 220. Therefore, the number of third wiring lines 273 is determined by the circuit structure of the scan driver 220. Thus, for convenience only, FIG. 5 depicts three wiring lines in the third wiring lines 273, but the invention is not thus limited.

The fourth wiring line 274 supplies the first pixel power source ELVDD supplied during the inspection in a unit sheet to the pixel unit 230 formed in each of the organic light emitting displays 210.

The second wiring line group 280' is formed in the region between the organic light emitting displays 210 in the second direction to be commonly coupled to the organic light emitting displays 210 positioned in the same row of the mother substrate 200'.

The second wiring line group 280' is formed in the region between the organic light emitting displays 210 in the second direction to be commonly coupled to the organic light emitting displays 210 positioned in the same row of the mother substrate 200'.

The second wiring line group 280' includes an 11$^{th}$ wiring line 281 that receives the second pixel power source ELVSS, a 12$^{th}$ wiring line 282 that receives an initiation power source Vinit, a 13$^{th}$ wiring line 283 that receives a red inspection signal, a 14$^{th}$ wiring line 284 that receives a green inspection signal, a 15$^{th}$ wiring line 285 that receives a blue inspection signal, a 16$^{th}$ wiring line 286 that receives an inspection control signal, and a 17$^{th}$ wiring line 287 that receives a bias signal.

The 11$^{th}$ wiring line 281 supplies the second pixel power source ELVSS supplied during the inspection in a unit sheet to the pixel unit 230 formed in each of the organic light emitting displays 210. The 12$^{th}$ wiring line 282 supplies the initiation power source Vinit supplied during the inspection in a unit sheet to the pixel unit 230 formed in each organic light emitting displays 210. The 13$^{th}$ wiring line 283 supplies the red inspection signal supplied during the inspection in a unit sheet to the inspector 260 formed in each of the organic light emitting displays 210. The 14$^{th}$ wiring line 284 supplies the green inspection signal supplied during the inspection in a unit sheet to the inspector 260 formed in each of the organic light emitting displays 210. The 15$^{th}$ wiring line 285 supplies the blue inspection signal supplied during the inspection in a unit sheet to the inspector 260 formed in each of the organic light emitting displays 210. The 16$^{th}$ wiring line 286 supplies the inspection control signal supplied during the inspection in a unit sheet to the inspector 260 formed in each of the organic light emitting displays 210. The 17$^{th}$ wiring line 287 supplies the bias signal supplied during the inspection in a unit sheet to the data distributor 250 formed in each of the organic light emitting displays 210.

The intersection part between the first and second wiring line groups 270', 280' is positioned in an upper row of the organic light emitting display 210 in which the second wiring line group 280' is positioned, that is, at the lower edge of the organic light emitting display 210 coupled to the second wiring line group 280'.

Therefore, a part of the second wiring line group 280' that intersects the first wiring line group 270' is formed to be bent in an upper row direction.

The intersection part between the second wiring line group 280' and the first wiring line group coupled to the organic light emitting displays positioned in an i$^{th}$ (i is a natural number) row among the organic light emitting displays 210 formed on the mother substrate 200' is positioned within the scribing lines 290 of the organic light emitting displays positioned in the i$^{th}$ row.

The outer most regions of the second wiring line group 280' region excluding the intersection parts are positioned above the organic light emitting displays 210 in a lower row that are not coupled thereto. The coupling points between the first and second wiring line groups 270', 280' and the organic light emitting displays 210 are positioned outside the scribing lines 290 such that the first and second wiring line groups 270', 280' and the organic light emitting displays 210 are insulated from each other after scribing.

That is, the outer most regions excluding the intersection parts in the second wiring line group 280' region coupled to the i$^{th}$ row organic light emitting displays are positioned within the scribing lines 290 of the (i+1)$^{th}$ organic light emitting displays.

As described above, a part of the second wiring line group 280' that intersects the first wiring line group 270' is bent so that the intersection part between the first and second wiring line groups 270', 280' does not overlap the seal 330.

Therefore, it is possible to prevent the wiring lines included in the first and second wiring groups 270', 280' from being shorted by the external force applied during the sealing process of attaching the supporting substrate and the sealing substrate 320 to each other. That is, the stability of the wiring lines included in the first and second wiring groups 270', 280' is secured.

Therefore, during the inspection in a unit sheet, the power sources and/or signals are smoothly supplied to the organic light emitting displays 210 so that the inspection in a unit sheet is effectively performed.

A pad unit 295' is formed on one side of each of the organic light emitting displays 210. That is, after the organic light emitting displays 210 are scribed and separated from the mother substrate 200', the organic light emitting displays 210 receive driving power sources and/or signals supplied through the pad unit 295' to be driven in response to the driving power sources and/or signals.

According to an exemplary embodiment of the present invention, the pad unit 295' includes a bias pad Pb for biasing at least a part of the first and second wiring line groups 270', 280' floated after the organic light emitting displays 210 are scribed.

For example, the last pad at least at one edge of the pad unit 295', in particular, at both edges of the pad unit 295' can be set as the bias pad Pb. Aligning marks Ma are formed on the bias pad Pb in the direction of the first and second wiring line groups 270', 280', that is, in a perpendicular horizontal direction.

The aligning marks Ma are marks for aligning the organic light emitting displays 210 when the organic light emitting displays 210 are coupled to a pad such as a printed circuit board after being scribed from the mother substrate 200' and are formed to be refracted from the last pad of the pad unit 295' to the outside of the pad unit 295' in a right angle direction.

According to an exemplary embodiment of the present invention, because the last pad of the pad unit 295', that is, the bias pad Pb must be coupled to the first and second wiring line groups 270', 280' after being scribed, the aligning marks Ma of the pad unit 295' are formed to extend onto a region of the bent second wiring line group 280'.

In addition in order to couple the first and second wiring line groups 270', 280' to the bias pad Pb, a protecting layer on one region of the second wiring line group 280' is removed so that a part is exposed to the outside. That is, according to an exemplary embodiment of the present invention, a via hole 610 that partially exposes the protecting layer such as an inorganic insulating layer that is commonly formed on the wiring lines is formed in one region of the second wiring line group 280' such that the second wiring line group 280 can be electrically coupled to the pad unit such as the printed circuit board after the scribing process.

On the other hand, because the end of the first wiring line group 270' is floated after scribing such that the floated end can serve as a path through which the ESD is induced, the first wiring line group 270' must be coupled to the bias pad Pd.

Therefore, coupling wiring lines for coupling the first wiring line group 270' to the organic light emitting displays 210 are coupled to the first wiring line group 270' by the contact hole in the scribing lines 290 of the organic light emitting displays 210 to be bent to intersect the scribing line 290 that contacts the lower part of the pad unit 295' at the edge of the second wiring line group 280'. The coupling wiring lines are bent again outside the scribing line 290 to be coupled to the scan driver 220 and the pixel unit 230 through the pad unit 295' in a panel.

For example, the coupling wiring line for electrically coupling the first wiring line group 270' and the organic light emitting display of an $i^{th}$ row can be formed to be electrically coupled to the elements of the organic light emitting display 210 of the $i^{th}$ row from one region of the first wiring group 270' formed in the organic light emitting display 210 of the $i^{th}$ row through the aligning marks Ma, a dummy region on an organic light emitting display of an $(i+1)^{th}$ row, and the pad 295' of the $i^{th}$ organic light emitting display 210.

Because the first wiring line group 270' after being scribed must be electrically coupled to the bias pad Pb, the protecting layer on one region of the coupling wiring line formed on the same line as the pad unit 295' is removed to overlap the aligning marks Ma. Therefore, a part of the connection wiring line is exposed to the outside.

That is, according to an exemplary embodiment of the present invention, the via hole 610 that partially exposes the protecting layer is formed in one region of the coupling wiring line for coupling the first wiring line group 270' and the organic light emitting displays 210. Therefore, the first wiring line group 270' is electrically coupled to the bias pad formed on the printed circuit board after the scribing process.

As described above, at least a part of the first and second wiring line groups 270', 280' is exposed and the exposed part is coupled to the bias pad Pb after scribing so that it is possible to keep the ESD from being induced through the first and second wiring line groups 270', 280'. Therefore, it is possible to stabilize the operation of the organic light emitting display 210. The organic light emitting display 210 after being scribed will be described hereinafter.

In addition, according to an exemplary embodiment of the present embodiment, during the inspection in a unit sheet, in a state where the distributor 250 is maintained to be turned off, the red, blue, and green inspection signals are supplied to the pixel unit 230 through the inspector 260 so that it is possible to solve problems caused by the signal delay that can be generated during the inspection performed using the data distributor 250.

For example, during the inspection in a unit sheet, in a state where the plurality of transistors $M_1$ to $M_{3m}$ included in the inspector 260 are turned on, the red, blue, and green inspection signals are supplied such that it is possible to solve problems caused by not securing time for the pixel circuit to charge the data voltage. In addition, because the inspection is performed without passing through the data distributor 250, it is not necessary to synchronize the inspection control signal and the inspection signal, the red clock signal, the green clock signal, and the blue clock signal such that difficulties in synchronization is removed.

In the above embodiment, for convenience, the first to fourth wiring groups 271 to 274 and the $11^{th}$ to $17^{th}$ wiring lines 281 to 287 are described as included in one wiring line group in the first and second wiring line group 270', 280'. However, the present invention is not thus limited. For example, the first wiring line 271 that supplied the first pixel power source ELVDD can be set to be included in all of the first and second wiring line groups 270', 280' and to be included in either the first or second wiring line group 270', 280'.

Figure 7:
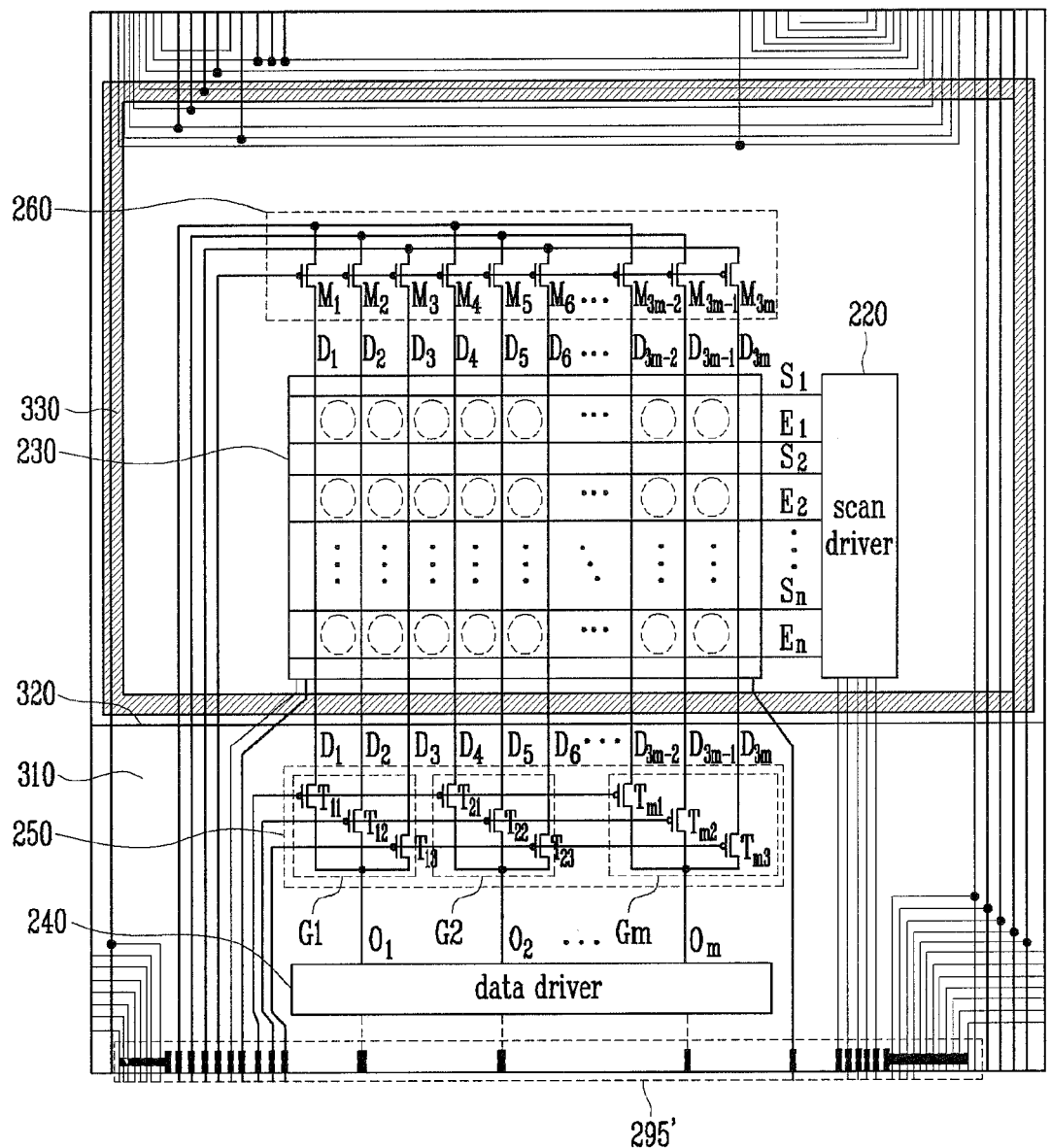
FIG. 7 is a block diagram of the scribed organic light emitting display illustrated in FIG. 4 and FIG. 5.

FIG. 7 is a block diagram illustrating the scribed organic light emitting display in FIG. 4 and FIG. 5. Referring to FIG. 7, the same elements as the elements of FIG. 4 and FIG. 5 are denoted by the same reference numeral and detailed description thereof will be omitted.

Referring to FIG. 7, the scribed organic light emitting display includes a pixel unit 230 including a plurality of pixels positioned in the intersection parts among scan lines S, emission control lines E, and data lines D, a scan driver 220 for supplying scan signals to the scan lines S, a data driver 240 for supplying data signals to the data lines D, a pad unit 295' including a plurality of pads for supplying driving power sources or signals to at least one of the pixel unit 230, the scan driver 220, and the data driver 240.

In addition, the organic light emitting display further includes a transistor group (inspector) 260 positioned above the pixel unit 230 to be coupled to one end of each of the data lines D and a data distributor 250 positioned below the pixel unit 230 to be coupled between the other ends of the data lines D and the data driver. The transistor group (inspector) 260 and the data distributor 250 supply the power sources and/or signals from the pad 295'

The transistor group (inspector) 260 is maintained to be turned off by the signal supplied through the pad unit 295'. The scan driver 220, the pixel unit 230, the data driver 240, and the data distributor 250 are driven by the power sources and/or signals supplied from the outside through the pad unit 295'.

The first wiring group and first and second bending wiring lines are further formed at the edge of the non-pixel region of the organic light emitting display.

To be specific, the first wiring line group is vertically formed at the edge of the pixel unit 230. The first bending wiring lines are bent to intersect the first wiring line group at least on one side, in particular, at least at both edges and the second bending wiring lines are horizontally formed at the edge above the pixel unit 230 such that both ends are floated to be bent without intersecting the first wiring line group.

The first wiring line group of the organic light emitting display is a part of the first wiring line group 270' of the mother substrate 200' positioned within the scribing line 290 of the organic light emitting display. The first and second bending wiring lines are a part of the second wiring line group 280' of the mother substrate 200' within the scribing line 290 of the organic light emitting display.

The first wiring line group and the first and second bending wiring lines of the organic light emitting display are electrically insulated from the pixel unit 230, the scan driver 220, the data driver 240, the data distributor 250, and the transistor group (inspector) 260. That is, the first wiring line group and the first and second bending wiring lines do not participate in the driving of the organic light emitting display.

According to an exemplary embodiment of the present invention, the bias pad Pb coupled to the first wiring line group and the first bending wiring lines of the organic light emitting display is formed in the pad unit 295'.

To be specific, the last pads at least on one side, for example, or on both sides of the pad unit 295' are set as the bias pad Pd. The bias pad Pb is coupled to the bias pad of the printed circuit board to receive a bias signal from the printed circuit board when the printed circuit board is attached.

The bias pads Pb are extended in the direction of the adjacent first bending wiring lines to be electrically coupled to the first bending wiring lines. The bias signal is supplied to the first bending wiring lines.

In addition, the bias pads Pb are electrically coupled to the first wiring line group. For example, the bias pads Pb are coupled to the coupling wiring lines of the first bent wiring line group like the first bending wiring lines to supply the bias signal to the first wiring line group.

As described above, in the organic light emitting display according to an exemplary embodiment of the present invention, the mother substrate inspection wiring lines floated after the organic light emitting displays are scribed, in particular, the coupling wiring lines of the first wiring line group and the first bending wiring lines positioned on the same line as the pad unit 295' are coupled to the bias pads Pb and the bias signal is supplied to the coupling wiring lines of the first wiring line group and the first bending wiring lines.

Therefore, the induction of the ESD from the outside through the mother substrate inspection wiring lines is minimized to stabilize the operation of the organic light emitting display.

The organic light emitting display includes a supporting substrate (first substrate) 310 including a pixel unit 230, a scan driver 220 formed (or mounted) in the non-pixel region peripheral to the pixel unit 230, a data driver 240, a data distributor 250, and an inspector 260, a sealing substrate (second substrate) 320 provided on the supporting substrate 310 to overlap at least the pixel unit 230, and a sealing material 330 applied along the edge of the sealing substrate 320 that faces the supporting substrate 310 to attach the supporting substrate 310 and the sealing substrate 320 to each other.

The seal 330 is provided not to overlap the intersection part of the first wiring line group and the first bending wiring line groups and the second bending wiring lines do not intersect the other wiring lines, thereby a short defect is prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display, comprising:
   a pixel unit having a plurality of pixels positioned in intersection parts between scan lines and data lines;
   a scan driver for supplying scan signals to the scan lines;
   a data driver for supplying data signals to the data lines;
   a pad unit arranged on one side of the pixel unit and having a plurality of pads for supplying driving power sources or signals from outside to at least one of the pixel unit, the scan driver, and the data driver;
   a first wiring line group extending in a first direction parallel to a closest side of the pixel unit and having both ends floating; and
   first bending wiring lines bent at one or more edges of the pad unit to intersect the first wiring line group,
   wherein the pad unit includes at least one bias pad extended in a direction of the first bending wiring lines and is electrically coupled to the first bending wiring lines.

2. The organic light emitting display of claim 1, wherein:
   the first bending wiring lines are at both edges of the pad unit, and
   a last pad on each side of the pad unit is a bias pad and is coupled to adjacent first bending wiring lines.

3. The organic light emitting display of claim 1, wherein:
   the bias pad is electrically coupled to the first wiring line group, and
   the first wiring line group and the first bending wiring lines receive a bias signal from the bias pad.

4. The organic light emitting display of claim 1, further comprising second bending wiring lines extending in a second direction at an upper edge of the pixel unit, both ends of the second bending wiring line being bent to not intersect the first wiring line group.

5. The organic light emitting display of claim 1, further comprising:
   a first substrate on which the pixel unit, the scan driver, the data driver, the pad unit, the first wiring line group, the first bending wiring lines, and second bending wiring lines in a non-pixel region around the pixel unit are formed;
   a second substrate facing the first substrate to overlap one region of the first substrate including the pixel unit; and
   a seal for attaching the second substrate to the first substrate at an edge of the second substrate,
   wherein the seal does not overlap the intersection parts between the first wiring line group and the first bending wiring lines.

6. The organic light emitting display of claim 1, further comprising:
   a transistor group coupled to one end of each of the data lines; and
   a data distributor coupled between the other ends of the data lines and the data driver.

7. The organic light emitting display of claim 6, wherein the transistor group is turned off by signals supplied from the pad unit.

8. The organic light emitting display of claim 1, wherein the first wiring line group and the first bending wiring lines are electrically insulated from the pixel unit, the scan driver, and the data driver.

* * * * *